United States Patent

Kuramoto et al.

[11] Patent Number: 5,691,010
[45] Date of Patent: Nov. 25, 1997

[54] ARC DISCHARGE PLASMA CVD METHOD FOR FORMING DIAMOND-LIKE CARBON FILMS

[75] Inventors: Keiichi Kuramoto, Hirakata; Hitoshi Hirano, Nishinomiya; Yoichi Domoto, Hirakata; Seiichi Kiyama, Takatsuki, all of Japan

[73] Assignee: Sanyo Electric Co., Ltd., Moriguchi, Japan

[21] Appl. No.: 324,783

[22] Filed: Oct. 18, 1994

[30] Foreign Application Priority Data

Oct. 19, 1993 [JP] Japan ................................. 5-261120
Nov. 29, 1993 [JP] Japan ................................. 5-298241

[51] Int. Cl.$^6$ ............................ B05D 3/06; C23C 16/26; H05H 1/48
[52] U.S. Cl. ........................... 427/577; 427/580; 427/249; 427/255.5; 427/122
[58] Field of Search ...................... 427/577, 580, 427/571, 249, 122, 255.5; 423/446

[56] References Cited

U.S. PATENT DOCUMENTS

| | | |
|---|---|---|
| 4,647,494 | 3/1987 | Meyerson . |
| 4,707,384 | 11/1987 | Schachner et al. . |
| 4,767,641 | 8/1988 | Kieser et al. ............... 427/580 |
| 4,915,977 | 4/1990 | Okamoto et al. ........... 427/580 |
| 5,045,165 | 9/1991 | Yamashita . |
| 5,175,658 | 12/1992 | Chang et al. . |
| 5,204,145 | 4/1993 | Gasworth .................... 427/577 |
| 5,380,349 | 1/1995 | Taniguchi et al. . |
| 5,401,543 | 3/1995 | O'Neill et al. ............. 427/580 |
| 5,427,827 | 6/1995 | Shing et al. . |
| 5,474,816 | 12/1995 | Falabella .................... 427/580 |

FOREIGN PATENT DOCUMENTS

| | | |
|---|---|---|
| 0503822 | 9/1992 | European Pat. Off. . |
| 3047888 | 7/1982 | Germany . |
| 60-103099 | 6/1985 | Japan . |
| 60-147113 | 8/1985 | Japan . |
| 60-195092 | 10/1985 | Japan . |
| 63-286334 | 11/1988 | Japan . |
| 1-259163 | 10/1989 | Japan . |
| 1-317197 | 12/1989 | Japan . |
| 2-133573 | 5/1990 | Japan . |
| 2-225672 | 9/1990 | Japan . |
| 3-064468 | 3/1991 | Japan . |
| 3-130363 | 6/1991 | Japan . |
| 3-175620 | 7/1991 | Japan . |
| 4-318175 | 11/1992 | Japan . |
| 4-329879 | 11/1992 | Japan . |
| 4-341582 | 11/1992 | Japan . |
| 5-190450 | 7/1993 | Japan . |
| 5-239655 | 9/1993 | Japan . |

OTHER PUBLICATIONS

"Shinku" vol. 25, No. 12, pp. 781–787, Large Diameter Plasma for Ion Plating of Large Volume by Joshin Uramoto, Jun. 1982.
JIS G0202, regarding Vickers hardness, pp. 14–17 No Year, month data?.
Komatsu et al, Shinku, 32(3), pp. 353–355 (Japanese) 1989.
P. Koidl et al. "Plasma Deposition, Properties and Structures of Amorphous Hydrogenated Carbon Films", pp. 41–69, Materials Science Forum, vols. 52,53 (1989) Trans. Tech. Publications.

*Primary Examiner*—Roy V. King
*Attorney, Agent, or Firm*—W. G. Fasse; W. F. Fasse

[57] ABSTRACT

A method of forming a diamond-like carbon film on a substrate arranged in a vacuum chamber includes the steps of generating an arc-discharge plasma current in the vacuum chamber, supplying a reaction gas containing carbon atoms, such as $CH_4$ gas for example, into the arc-discharge plasma current, applying a high-frequency voltage to the substrate so that a self-bias developed in the substrate is not more than $-200$ V, and forming a diamond-like carbon film from the reaction gas on the substrate that is supplied with the high-frequency voltage.

20 Claims, 9 Drawing Sheets

DC VOLTAGE FOR DISCHARGE (V)

ARC DISCHARGE PLASMA CVD METHOD FOR FORMING DIAMOND-LIKE CARBON FILMS

BACKGROUND OF THE INVENTION

1. Field of the Invention

The present invention relates to a method of and an apparatus for forming a diamond-like carbon film on a substrate such as an electric shaver blade, a semiconductor material, a magnetic head or a sliding part of a device, for improving its characteristics and protecting its surface, and more particularly, it relates to a method of and an apparatus for forming a diamond-like carbon film through an arc-discharge plasma current.

2. Description of the Background Art

In general, a diamond-like carbon film has been formed by a method such as ion beam sputtering, ion plating or plasma CVD.

On the other hand, ECR plasma CVD has recently been proposed as a method which can form a homogeneous film at a low temperature on a larger surface area as compared with the above method (refer to Japanese Patent Laying-Open No. 3-64468 (1991) etc.). This ECR plasma CVD is adapted to cause electron cyclotron resonance in an ECR ion source, thereby generating a high density plasma and applying a plasma current through a divergent magnetic field to a substrate for forming a film thereon.

In the aforementioned ECR plasma CVD, however, the film as formed is limited in area since its range is restricted by the plasma current which is applied to the substrate.

To this end, there has recently been proposed ion plating employing an arc-discharge plasma current generation source as a method which can form a film in a larger area as compared with the ECR plasma CVD (refer to japanese Patent Laying-Open No. 1-259163 (1989) and "Shinku" Vol. 25, No. 12, 1982, pp. 781–787).

FIG. 8 is a schematic sectional view showing an apparatus for such ion plating. Referring to FIG. 8, a pressure gradient plasma gun 1 serving as an arc-discharge plasma current generation source is provided in the exterior of a vacuum chamber 8. This pressure gradient plasma gun 1 is formed by a cathode 2, a first intermediate electrode 3, and a second intermediate electrode 4. The first and second intermediate electrodes 3 and 4 are located between the cathode 2 and an anode 5, which is provided in the vacuum chamber 8. These first and second intermediate electrodes 3 and 4 contain an annular permanent magnet 6 and an air-core coil 7 respectively.

A discharge gas inlet 12 is provided in the center of the pressure gradient plasma gun 1, for introducing a discharge gas such as Ar gas from the exterior. A discharge power source 10 is connected between the pressure gradient plasma gun 1 and the anode 5, for starting and stationarily maintaining a discharge.

The vacuum chamber 8 is provided in its wall portion with a reaction gas inlet 13 for supplying a reaction gas which is required for forming a film, and an exhaust port 15 for evacuating the vacuum chamber 8.

An arc-discharge plasma current 9 is generated across or between the anode 5 which is provided in the vacuum chamber 8 and the pressure gradient plasma gun 1. A magnet 14 is provided under the anode 5, in order to focus the arc-discharge plasma current 9 on the anode 5. A substrate 16 is arranged in the vacuum chamber 8, so as to be positioned in the arc-discharge plasma current 9. A dc power source 11 is connected between the substrate 16 and the anode 5, in order to apply a negative bias voltage to the substrate 16 with respect to the arc-discharge plasma current 9.

In order to form a film on the substrate 16, a discharge gas is first supplied from the discharge gas inlet 12, so that the arc-discharge plasma current 9 of this discharge gas is generated from the pressure gradient plasma gun 1 and concentrated onto the anode 5. Due to such concentration of the arc-discharge plasma current 9, ions of a deposition material generated in the anode 5 are emitted toward the negatively biased substrate 16. At the same time, a reaction gas which is supplied through the reaction gas inlet 13 passes through the arc-discharge plasma current 9, so as to be emitted toward the substrate 16 in an ionized or neutralized state. Thus, a compound film of the ions of the deposition material and the reaction gas is formed on the substrate 16.

According to this method, it is possible to form a film at a high film forming rate without the need of employing a filament for ionizing the deposition material.

When a diamond-like carbon film is formed on a substrate by such a conventional method, however, it may not be possible to attain high hardness. In particular, it is impossible with such a conventional method to form a diamond-like carbon film having high hardness on a substrate consisting of an insulating material. On the other hand, a method is needed for forming a diamond-like carbon film at a low temperature on a substrate consisting of a material such as plastic resin, which may be deformed or changed in characteristics by a temperature rise.

In the conventional method, further, the efficiency of decomposition of the reaction gas which is introduced into the vacuum chamber is so inferior that a large amount of the reaction gas not yet decomposed remains in the vacuum chamber.

SUMMARY OF THE INVENTION

An object of the present invention is to provide a method of and an apparatus for forming a diamond-like carbon film having high hardness on a substrate by ion plating employing an arc-discharge plasma current.

Another object of the present invention is to provide a method and an apparatus which can form a diamond-like carbon film having high hardness at a low temperature on a substrate of plastic resin or the like.

Still another object of the present invention is to provide a method of and an apparatus for forming a diamond-like carbon film which can improve decomposition efficiency for a reaction gas.

The method of forming a diamond-like carbon film according to the present invention comprises the steps of generating an arc-discharge plasma current in a vacuum chamber, supplying a reaction gas containing carbon atoms into the arc-discharge plasma current, applying a high-frequency voltage to a substrate so that a self-bias developed in the substrate is not more than −200 V, and forming a diamond-like carbon film from the reaction gas on the substrate which is supplied with the high-frequency voltage.

It is possible to form a diamond-like carbon film having high hardness by applying a high-frequency voltage to the substrate so that a self-bias developed in the substrate is not more than −200 V.

When the substrate is a resin substrate or the like which may be deformed or changed in characteristics by temperature rise, it is preferable to apply the high-frequency voltage to the substrate so that the self-bias developed in the substrate is in a range from −600 to −200 V.

According to the present invention, the reaction gas is preferably supplied from a location close to an anode which is provided in the vacuum chamber. Thus, a larger amount of the reaction gas which is supplied into the vacuum chamber passes through the arc-discharge plasma current, whereby it is possible to improve decomposition efficiency for the reaction gas. In this case, the reaction gas is preferably supplied to the substrate in the form of a shower, so that it is possible to homogeneously emit the reaction gas in an ionic or neutral active state having high reactivity to the substrate.

According to the present invention, further, it is preferable to arrange the substrate not in the arc-discharge plasma current but in the vicinity thereof. Thus, it is possible to prevent the substrate from being heated to a high temperature.

In addition, it is preferable to form a diamond-like carbon film on the substrate while rotating the substrate with respect to the arc-discharge plasma current. Thus, it is possible to homogeneously form the diamond-like carbon film on the substrate.

An apparatus for forming a diamond-like carbon film according to the present invention comprises a vacuum chamber for receiving a substrate therein, an arc-discharge plasma current generation source having a cathode for generating an arc-discharge plasma current in the vacuum chamber, an anode which is provided in the vacuum chamber for forming arc discharge between the same and the arc-discharge plasma current generation source, reaction gas introduction means for supplying a reaction gas containing carbon atoms into the arc-discharge plasma current, and a high-frequency power source for applying a high-frequency voltage to the substrate.

In a preferred mode of the present invention, the high-frequency power source is adapted to apply a high-frequency voltage to the substrate so that a self-bias developed in the substrate is not more than −200 V. In the apparatus according to the present invention, the reaction gas introduction means is preferably provided in the anode. More preferably, the reaction gas introduction means is opposed to the substrate.

Further preferably, the reaction gas introduction means is provided with a plurality of emission holes for emitting the reaction gas in the form of a shower.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS AND OF THE BEST MODE OF THE INVENTION

Figure 1:
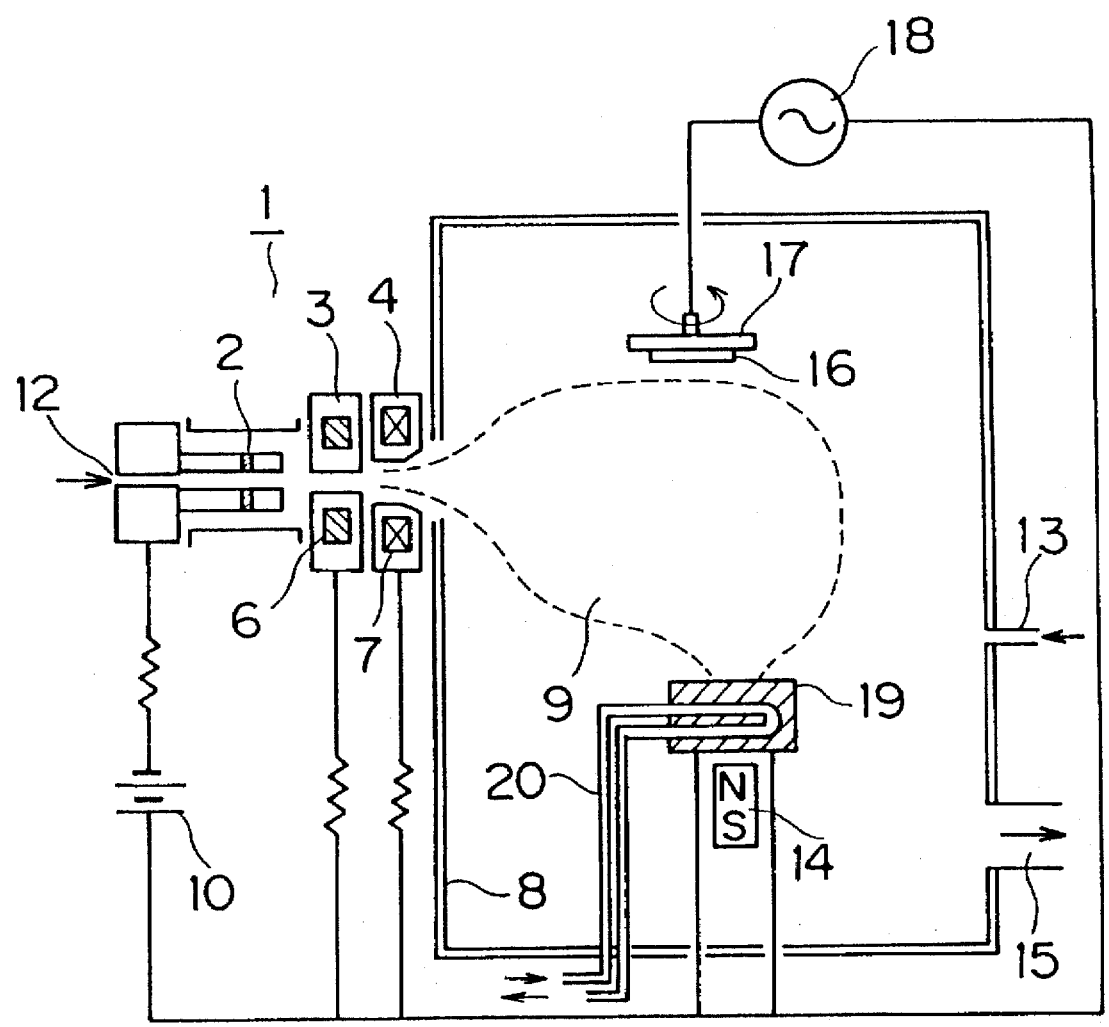
FIG. 1 is a shematic view showing a method of and an apparatus for forming a diamond-like carbon film according to an embodiment of the present invention.

FIG. 1 is a shematic view showing an embodiment of the present invention. Referring to FIG. 1, a pressure gradient plasma gun 1 serving as an arc-discharge plasma current generation source is provided in the exterior of a vacuum chamber 8. The pressure gradient plasma gun 1 is formed by a cathode 2, a first intermediate electrode 3, and a second intermediate electrode 4. The first and second intermediate electrodes 3 and 4 are located between the cathode 2 and an anode 19 which is provided in the vacuum chamber 8. These first and second intermediate electrodes 3 and 4 contain an annular permanent magnet 6 and an air-core coil 7 respectively.

A discharge gas inlet 12 is provided in the center of the pressure gradient plasma gun 1, for introducing a discharge gas such as Ar gas from the exterior. A discharge power source 10 is connected between the pressure gradient plasma gun 1 and the anode 19, for starting and stationarily maintaining a discharge.

The vacuum chamber 8 is provided in its wall portion with a reaction gas inlet 13 for supplying a reaction gas which is required for forming a film, and an exhaust port 15 for evacuating the vacuum chamber 8.

The anode 19 provided in the vacuum chamber 8 is made of copper, for serving as an arc-discharge anode. A refrigerant pipe 20 is provided in the anode 19 for cooling the same by a flow of water which is supplied from the exterior of the vacuum chamber 8, thereby preventing the anode 19 from being melted upon heating by an arc-discharge plasma current 9. According to this embodiment, the discharge power source 10 which is connected between the cathode 2 and the anode 19 applies a dc voltage of about 80 V.

A magnet 14 is provided under the anode 19 for focusing the arc-discharge plasma current 9. Further, a substrate holder 17 is provided in the vacuum chamber 8 so as to be positioned in the vicinity of the arc-discharge plasma current 9 which is generated from the pressure gradient plasma gun 1. This substrate holder 17 is rotatable during film formation as shown by the arrow at a rate of about 10 to 20 rpm. A substrate 16 is mounted on the substrate holder 17. It is possible to reduce irregularity in thickness of a diamond-like carbon film which is formed on the substrate 16 by rotating the substrate holder 17 during film formation. The substrate 16 and the substrate holder 17 are arranged not directly in the arc-discharge plasma current 9, but in the vicinity thereof, so that the same are not heated to a high temperature by the arc-discharge plasma current 9.

A high-frequency power source 18 having an oscillation frequency of 13.56 MHz and a maximum output of 500 W is connected between the substrate holder 17 and the anode 19. An output of the high-frequency power source 18 is so controlled as to apply a high-frequency voltage to the substrate holder 17 for developing a desired negative self-bias in the substrate 16.

When the high-frequency voltage is applied to the substrate 16, a negative self-bias is developed therein for the following reason: The speed of movement of ions caused by an electric field in the arc-discharge plasma current 9 is slower than that of electrons, due to a difference in mass therebetween. Therefore, the ions cannot follow the potential deflection during application of the high-frequency voltage, dissimilarly to the electrons. When the high-frequency voltage is applied to the substrate 16, therefore, a large amount of electrons are emitted to the substrate 16, thereby developing a negative self-bias therein.

The high-frequency power source 18 is employed for maintaining a surface of the substrate 16 at a negative potential with respect to the arc-discharge plasma current 9, since in contrast negative charges would be hardly caused on the substrate 16 which is made of an insulating material if a bias voltage from a dc power source were applied to a back surface of the substrate 16.

The apparatus shown in FIG. 1 was employed to form an amorphous diamond-like carbon film on the substrate 16 in practice. The substrate 16 was a plastic resin substrate.

The vacuum chamber 8 was first evacuated to $10^{-5}$ to $10^{-7}$ Torr, and then argon (Ar) gas was introduced into the vacuum chamber 8 from the discharge gas inlet 12 of the pressure gradient plasma gun 1 at a supply partial pressure of $3.9 \times 10^{-4}$ Torr. A voltage of about 80 V was applied from the discharge power source 10 to cause an arc discharge, thereby generating the arc-discharge plasma current 9 between the same and the anode 19. Methane ($CH_4$) gas was introduced into the vacuum chamber 8 from the reaction gas inlet 13 at a supply partial pressure of $1.2 \times 10^{-3}$ Torr. A high-frequency voltage of 11 W in output was applied to the substrate holder 17 from the high-frequency power source 18, so that a self-bias of $-200$ V was developed in the substrate 16.

The $CH_4$ gas which was introduced from the reaction gas inlet 13 in the aforementioned manner was decomposed by the action of the arc-discharge plasma current 9, brought into an ionic or neutral active state having high reactivity, and deposited on the substrate 16.

The aforementioned steps were carried out for about 20 minutes, for forming a diamond-like carbon film of 3000 Å in thickness on the substrate 16. The diamond-like carbon film as obtained exhibited hardness of 2000 Hv (Vickers hardness under JIS G0202).

Figure 2:
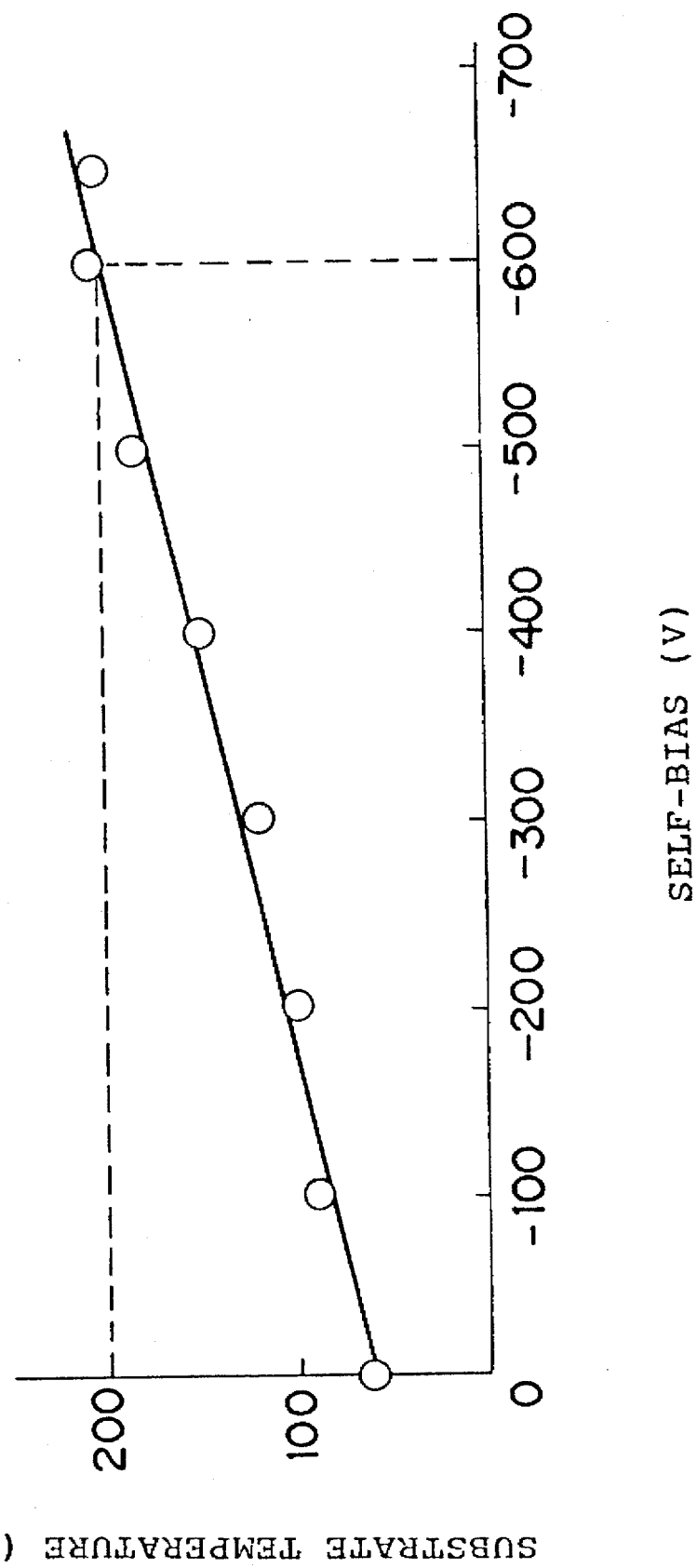
FIG. 2 illustrates the relation between a self-bias of a substrate and a substrate temperature when a diamond-like carbon film is formed through the apparatus shown in FIG. 1.

Then, the output of the high-frequency power source 18 was varied to change the self-bias developed in the substrate 16, thereby investigating the relation between the self-bias and the substrate temperature. FIG. 2 shows the result of the relation between the self-bias and the substrate temperature. As shown in FIG. 2, the substrate temperature was increased as the self-bias developed in the substrate 16 was increased due to increase in output of the high-frequency power source 18. For example, the substrate temperature was about 110° C. when the self-bias was $-200$ V, while the former was about 200° C. when the latter was $-600$ V. This is conceivably because the energy of ions reaching the substrate 16 increased, as the self-bias developed in the substrate 16 increased due to in increase of the output of the high-frequency power source 18, which caused an increase in the substrate temperature as the result.

Figure 3:
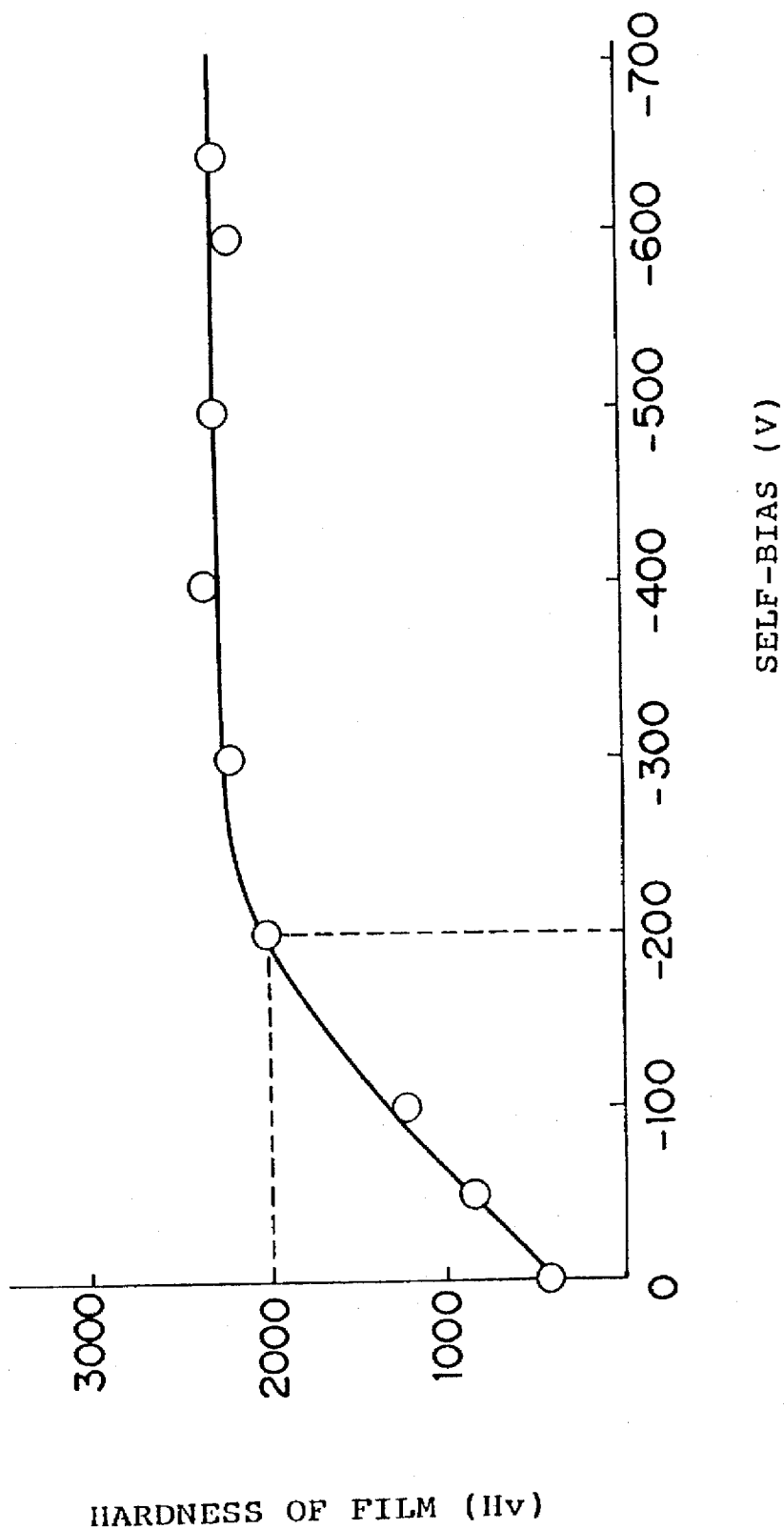
FIG. 3 illustrates the relation between the self-bias of the substrate and hardness of the film when a diamond-like carbon film is formed through the apparatus shown in FIG. 1.

Similarly, the self-bias developed in the substrate 16 was varied and the resulting hardness of the diamond-like carbon film formed on the substrate 16 was measured. FIG. 3 illustrates the relation between the self-bias and hardness of the film. The hardness is Vickers hardness, which was measured on the basis of JIS G0202. As shown in FIG. 3, the diamond-like carbon film formed on the substrate 16 exhibited low hardness of about 400 Hv when the self-bias developed in the substrate 16 was 0 V. When the self-bias was in a range of 0 to $-200$ V, the hardness of the film was increased following the reduction of the bias voltage i.e. a more negative bias voltage. When the self-bias was 200 V the film exhibited high hardness of about 2000 Hv. When the self-bias was below $-300$ V, the film exhibited a hardness of about 2300 Hv, substantially with no change for a further reduction in self-bias.

Thus, it is understood that it is possible to form a diamond-like carbon film having high hardness of at least about 2000 Hv on the substrate 16 by setting the high-frequency voltage of the high-frequency power source 18 so that the self-bias which is developed in the substrate 16 is not more than $-200$ V. It is also understood that it is possible to form a diamond-like carbon film having high hardness on the substrate 16 at a low temperature that causes no characteristic change of the substrate 16 by setting the self-bias which is developed in the substrate 16 in a range from $-600$ to $-200$ V, when the substrate 16 is a resin substrate or the like which is preferably prevented from temperature rise.

Figure 9:
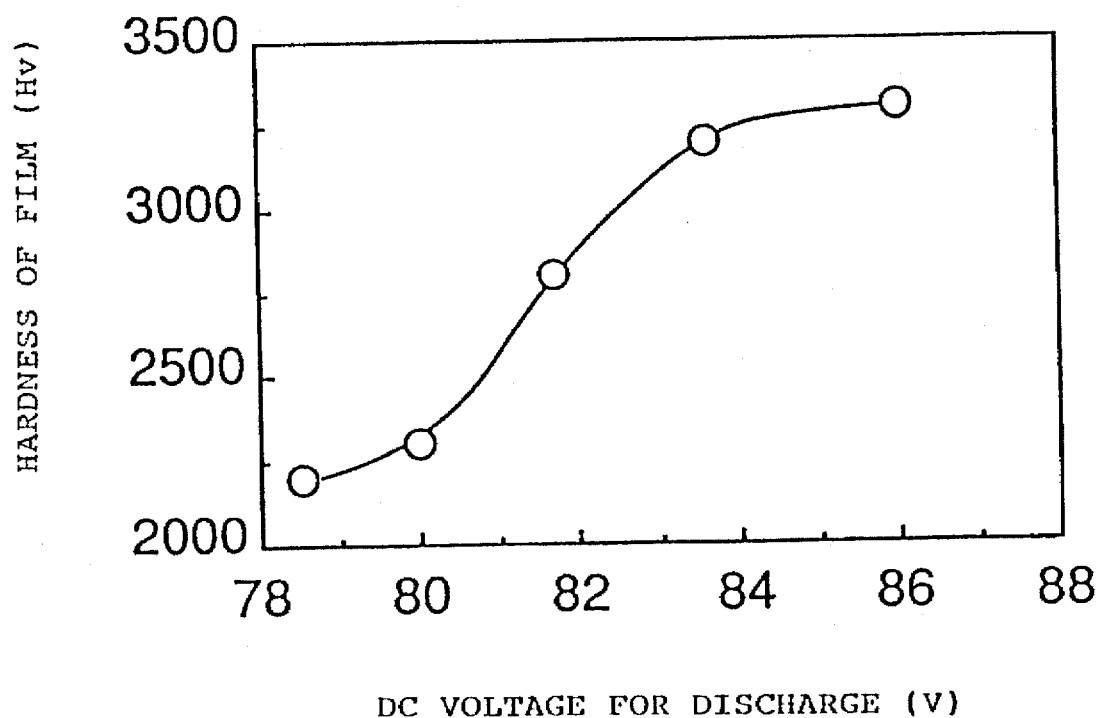
FIG. 9 illustrates the relation between a dc voltage for discharge and hardness of the film when a diamond-like carbon film is formed through the apparatus shown in FIG. 1.

Then, the voltage applied from the discharge power source 10 was varied from 78 V to 86 V, thereby investigating the relation between the voltage for discharge and hardness of the film. The self-bias developed in the substrate was set at $-300$ V and the other conditions were similar to the above example. As shown in FIG. 9, the hardness of the film was increased as the voltage was increased.

While the substrate 16 was a plastic resin substrate in the above example, results similar to those shown in FIGS. 2, 3 and 9 were obtained also when Ni, Si, glass and $Al_2O_3$—TiC substrates were employed. Further, results substantially similar to those shown in FIGS. 2, 3 and 9 were obtained also when the supply partial pressures for the Ar gas and the $CH_4$ gas supplied from the discharge gas inlet 12 and the reaction gas inlet 13 were set at values in the range of 1 to $20.0 \times 10^{-4}$ Torr.

The discharge gas, which is Ar gas in the aforementioned embodiment, may alternatively be prepared from another inert gas. Further, the reaction gas containing carbon atoms, which is from $CH_4$ gas in the aforementioned embodiment, may alternatively be prepared from a gas of $C_2H_6$, $C_6H_6$, $C_3H_8$, CO or $CO_2$, for example.

Figure 4:
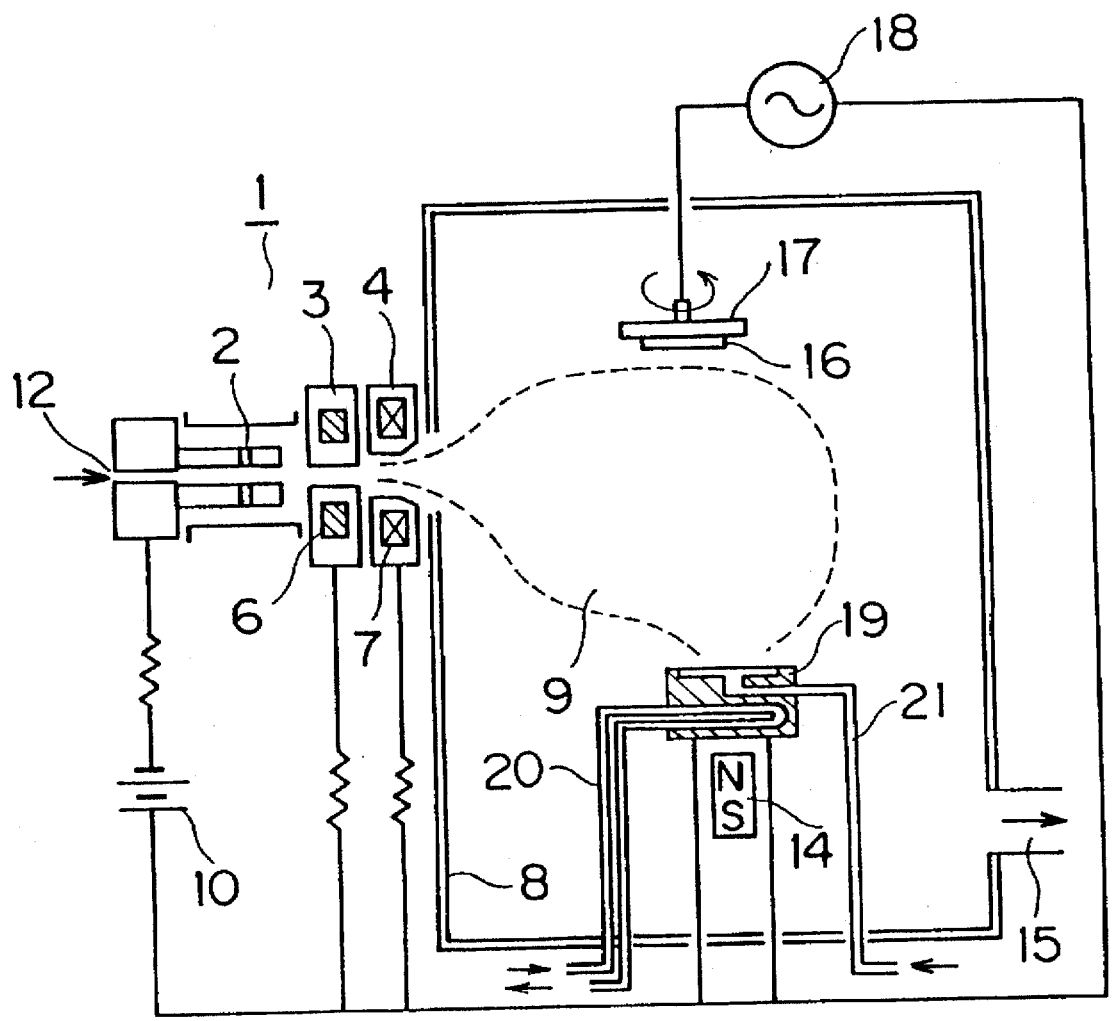
FIG. 4 is a shematic view showing a method of and an apparatus for forming a diamond-like carbon film according to another embodiment of the present invention.
Figure 5:
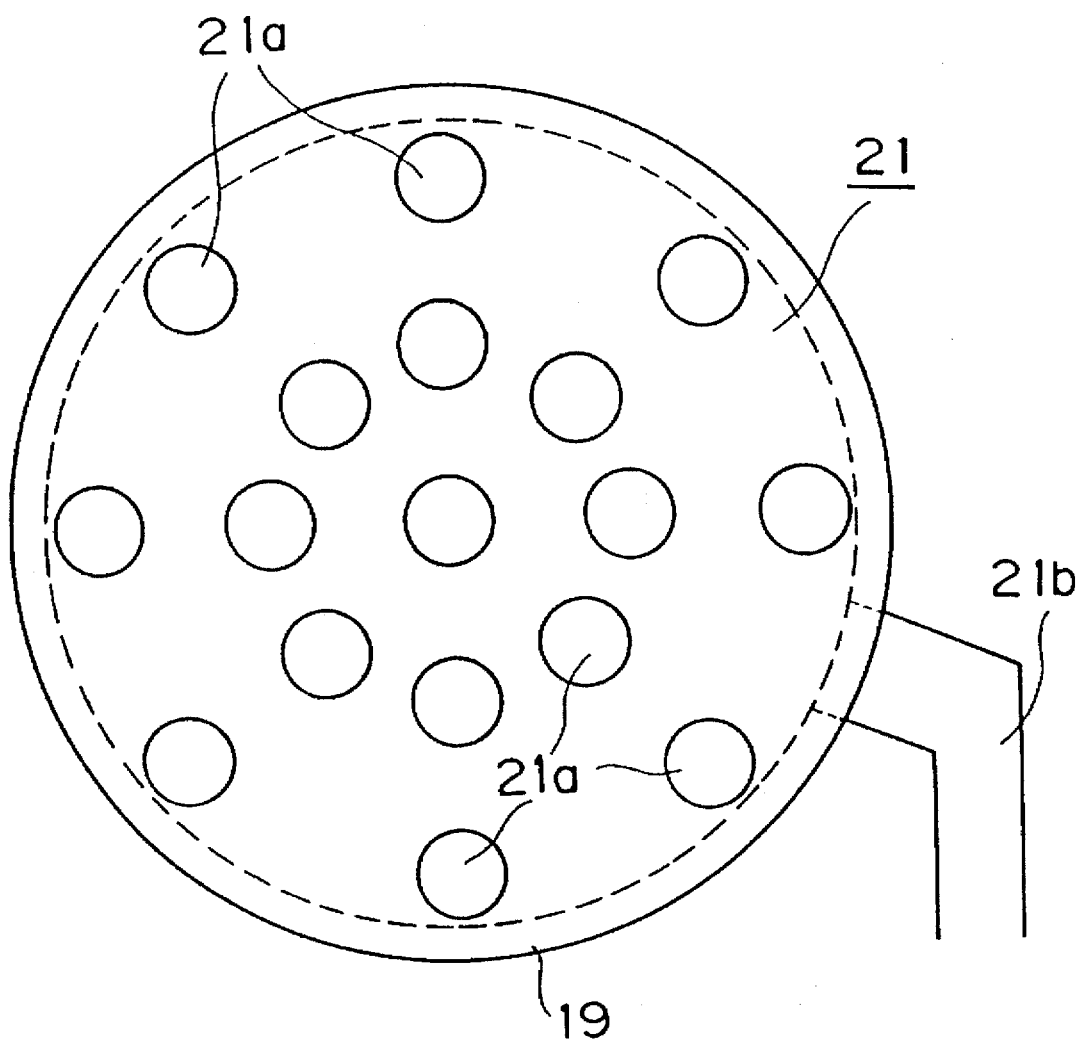
FIG. 5 is a plan view showing emission holes of reaction gas introduction means employed in the apparatus shown in FIG. 4.

FIG. 4 is a schematic view showing another embodiment of the present invention. Referring to FIG. 4, an apparatus according to this embodiment is similar to that shown in FIG. 1, except a reaction gas introduction means 21 is provided in an upper portion of an anode 19, while the reaction gas inlet 13 shown in FIG. 1 is not provided. FIG. 5 is a plan view showing emission holes 21a of the reaction gas introduction means 21 in the anode 19. As shown in FIG. 5, a plurality of emission holes 21a are provided along radii in a surface of the anode 19 which is opposed to a substrate 16. According to this embodiment, the anode 19 has seventeen emission holes 21a. The emission holes 21a are connected to a gas inlet pipe 21b for introducing $CH_4$ gas from the exterior of a vacuum chamber 8. The $CH_4$ gas which is introduced from the gas inlet pipe 21b is sprayed from the emission holes 21a in the form of a shower, so as to be directly supplied into an arc-discharge plasma current 9.

According to this embodiment, the $CH_4$ gas is supplied into the vacuum chamber 8 by the aforementioned reaction gas introduction means 21, whereby a larger amount of the $CH_4$ gas which is supplied into the vacuum chamber 8 passes through the arc-discharge plasma current 9, which thereby achieves an improved decomposition efficiency. Further, the $CH_4$ gas is supplied to the substrate 16 in the form of a shower, so that the $CH_4$ gas which is decomposed by the action of the arc-discharge plasma current 9 and brought into an ionic or neutral active state having high reactivity is homogeneously applied onto the substrate 16.

The apparatus shown in FIG. 4 was employed to form a diamond-like carbon film on the substrate 16 in practice. The substrate 16 was an Ni substrate.

The vacuum chamber 8 was first evacuated to $10^{-5}$ to $10^{-7}$ Torr, and argon (Ar) gas was introduced into the vacuum chamber 8 from a discharge gas inlet 12 of a pressure-gradient plasma gun 1 at a supply partial pressure of $3.9 \times 10^{-4}$ Torr. A voltage of about 80 V was applied to a discharge power source 10 to cause an arc discharge, thereby generating the arc-discharge plasma current 9 between the same and the anode 19. Methane ($CH_4$) gas was introduced into the vacuum chamber 8 from the reaction gas introduction means 21 at a supply partial pressure of $1.2 \times 10^{-3}$ Torr. A high-frequency voltage of 11 W in output was applied to a substrate holder 17 from a high-frequency power source 18, so that a self-bias of −200 V was developed in the substrate 16.

The $CH_4$ gas which was introduced from the reaction gas introduction means 21 in the aforementioned manner was decomposed by the action of the arc-discharge plasma current 9, brought into an ionic or neutral active state having high reactivity, and deposited on the substrate 16.

The aforementioned steps were carried out for about 20 minutes, for forming a diamond-like carbon film of 3000 Å in thickness on the substrate 16. The diamond-like carbon film as obtained exhibited hardness of 2000 Hv (Vickers hardness under JIS G0202).

Figure 6:
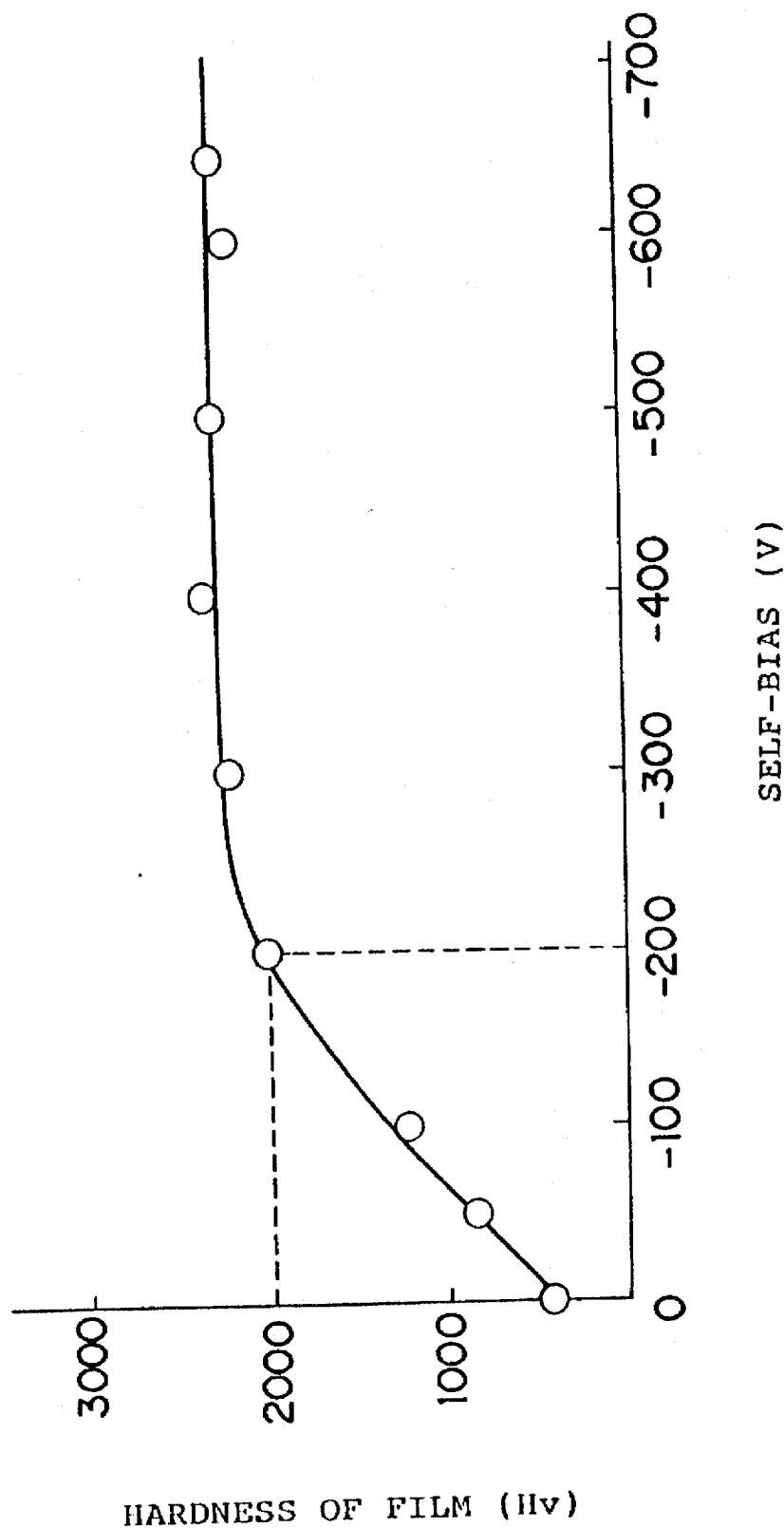
FIG. 6 illustrates the relation between a self-bias of a substrate and a substrate temperature when a diamond-like carbon film is formed through the apparatus shown in FIG. 4.

FIG. 6 shows the relation between the self-bias developed in the substrate 16, which was changed by varying the output of the high-frequency power source 18, and hardness of the diamond-like carbon film. As shown in FIG. 6, the diamond-like carbon film formed on the substrate 16 exhibited low hardness of about 400 Hv when the self-bias developed in the substrate 16 was 0 V. When the self-bias was in a range of 0 to −200 V, the hardness of the film was increased following the reduction of the bias voltage. When the self-bias was −200 V, the film exhibited high hardness of about 2000 Hv. When the self-bias was below −300 V, the film exhibited hardness of about 2300 Hv, substantially with no change for a further reduction in self-bias.

Thus, it is understood that it is possible to form a diamond-like carbon film having high hardness of at least about 2000 Hv on the substrate 16 also in the apparatus shown in FIG. 4, by setting the high-frequency voltage of the high-frequency power source 18 so that the self-bias developed in the substrate 16 is not more than −200 V.

Then, the relations between amounts of supply of the reaction gases for forming diamond-like carbon films through the apparatuses shown in FIGS. 4 and the 1 and resultant film forming rates were investigated. The reaction gas was introduced from a portion, i.e. a gas inlet, arranged close to the anode 19 in the apparatus shown in FIG. 4, while that in the apparatus shown in FIG. 1 was introduced from a gas inlet arranged the wall portion of the vacuum chamber 8.

Figure 7:
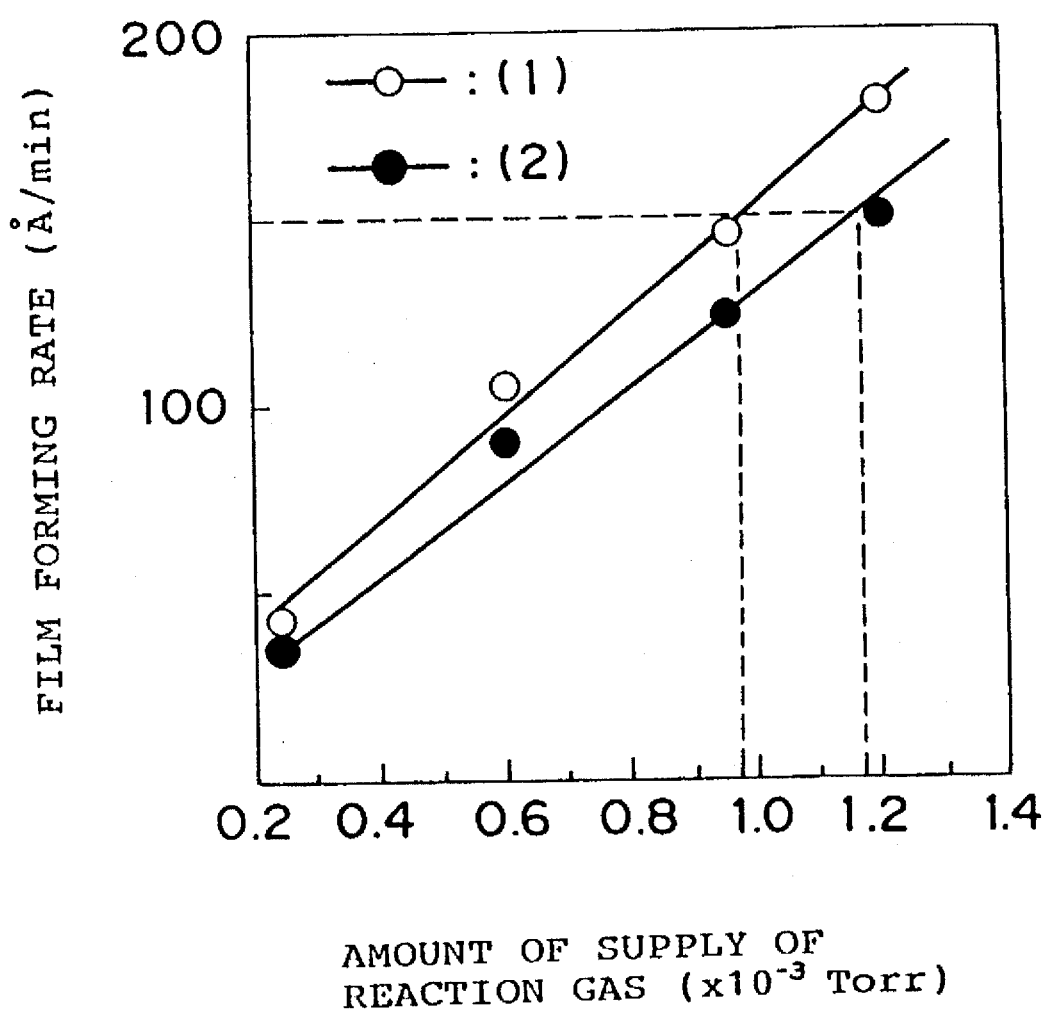
FIG. 7 illustrates the relations between amounts of supply of reaction gases and film forming rates when diamond-like carbon films are formed through the apparatuses shown in FIGS. 4 and 1.
Figure 8:
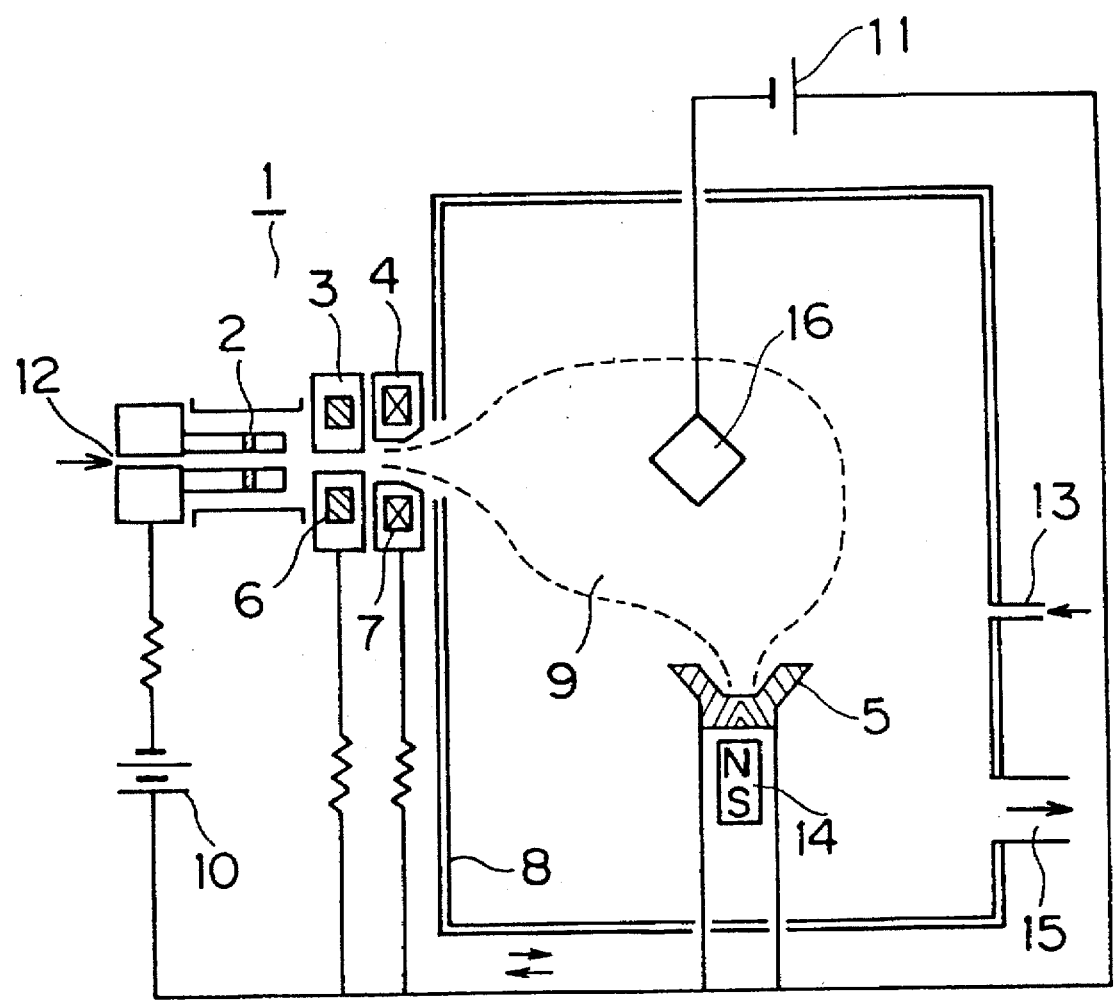
FIG. 8 is a shematic view for illustrating conventional ion plating employing an arc-discharge plasma current.

FIG. 7 shows the results (1) and (2) observed in the films which were formed through the apparatuses shown in FIGS. 4 and 1 respectively. As shown in FIG. 7, the film forming rates were increased following an increase of the amounts of supply of the reaction gases. For example, the apparatus shown in FIG. 1 required about $1.18 \times 10^{-3}$ Torr of the reaction gas for obtaining a film forming rate of 150 Å/min. as shown at (2), while the apparatus shown in FIG. 4 required only about $0.97 \times 10^{-3}$ Torr of the reaction gas as shown at (1). Thus, it is understood that it is possible to implement a desired film forming rate with a smaller amount of the reaction gas when the reaction gas is supplied from a gas inlet close to the anode 19 such as the gas introduction means 21 of FIG. 4.

While the substrate 16 was an Ni substrate in the above example, results similar to that shown in FIG. 6 were obtained also when Si, glass, resin and $Al_2O_3$—TiC substrates were employed. Further, results substantially similar to that shown in FIG. 6 were obtained also when the supply partial pressures for the Ar gas and the $CH_4$ gas were set at values in the range of 1 to $20.0 \times 10^{-4}$ Torr. In addition, a higher film formation rate was obtained when the amount of supply of the reaction gas was left intact.

The discharge gas, which is Ar gas in the aforementioned embodiment, may alternatively be prepared from another inert gas. Further, the reaction gas containing carbon atoms, which is $CH_4$ gas in the aforementioned embodiment, may alternatively be prepared from a gas of $C_2H_6$, $C_6H_6$, $C_3H_8$, CO or $CO_2$, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a diamond-like carbon film on a substrate arranged in a vacuum chamber, said method comprising the steps of:

generating an arc-discharge plasma current comprising applying a d.c. discharge voltage between a cathode and an anode in said vacuum chamber;

supplying a reaction gas containing carbon atoms into said arc-discharge plasma current;

applying a high-frequency voltage to said substrate so that said substrate develops a self-bias that is not more than −200 V; and forming said diamond-like carbon film from said reaction gas on said substrate to which said high-frequency voltage is applied; wherein said d.c. discharge voltage is controlled so as to control the hardness of said diamond-like carbon film to be formed.

2. The method of forming a diamond-like carbon film in accordance with claim 1, wherein said substrate is a resin substrate, and said high-frequency voltage is applied to said substrate such that said self-bias developed in said substrate is in a range from −600 to −200 V.

3. The method of forming a diamond-like carbon film in accordance with claim 1, wherein said reaction gas is supplied from at least one emission hole provided in said anode arranged in said vacuum chamber for concentrating said arc-discharge plasma current.

4. The method of forming a diamond-like carbon film in accordance with claim 3, wherein said reaction gas is supplied toward said substrate in the form of a shower from a plurality of said emission holes.

5. The method of forming a diamond-like carbon film in accordance with claim 1, wherein said substrate is arranged in the vicinity of said arc-discharge plasma current.

6. The method of forming a diamond-like carbon film in accordance with claim 1, further comprising rotating said substrate with respect to said arc-discharge plasma current during said forming of said diamond-like carbon film.

7. The method of forming a diamond-like carbon film in accordance with claim 1, wherein said substrate is a substrate selected from the group consisting of an Ni substrate, a resin substrate, an Si substrate, a glass substrate and an $Al_2O_3$-Tic substrate.

8. The method of forming a diamond-like carbon film in accordance with claim 1, wherein said reaction gas is made of a gas selected from the group consisting of $CH_4$, $C_2H_6$, $C_6H_6$, $C_3H_8$, CO and $CO_2$.

9. The method of forming a diamond-like carbon film in accordance with claim 5, wherein said substrate is not arranged within said arc-discharge plasma current.

10. The method of forming a diamond-like carbon film in accordance with claim 1, wherein said step of generating said arc-discharge plasma further comprises introducing a plasma discharge gas into said vacuum chamber through a plasma gun including said cathode, and wherein said step of applying said high-frequency voltage comprises applying said high-frequency voltage between said substrate and said anode.

11. The method of forming a diamond-like carbon film in accordance with claim 1, wherein said d.c. discharge voltage is in a range from 78 to 86 volts.

12. The method of forming a diamond-like carbon film in accordance with claim 11, wherein said step of applying said d.c. discharge voltage comprises setting said discharge voltage to a value in said range from 78 to 86 volts so as to achieve a selected hardness of said film in a range from about 2000 to about 3300 Hv.

13. The method of forming a diamond-like carbon film in accordance with claim 1, wherein said step of applying said high-frequency voltage comprises controlling a power level of said high-frequency voltage so that said self-bias is not more than −200 V.

14. The method of forming a diamond-like carbon film in accordance with claim 13, wherein said self-bias is in a range from −200 to −600 V.

15. The method of forming a diamond-like carbon film in accordance with claim 1, wherein said high-frequency voltage is applied between said substrate and an anode arranged in said vacuum chamber.

16. The method of forming a diamond-like carbon film in accordance with claim 1, wherein said substrate reaches a maximum temperature not more than 200° C. during said method.

17. The method of forming a diamond-like carbon film in accordance with claim 1, wherein said substrate reaches a maximum temperature in a range from 110° C. to 200° C.

18. The method of forming a diamond-like carbon film in accordance with claim 17, wherein said step of applying said high-frequency voltage comprises controlling a power level of said high-frequency voltage so that said substrate reaches a selected temperature in said range from 110° C. to 200° C.

19. The method of forming a diamond-like carbon film in accordance with claim 1, wherein said substrate consists of an insulating material.

20. The method of forming a diamond-like carbon film in accordance with claim 1, wherein said self-bias is not more than −300 V.

* * * * *

UNITED STATES PATENT AND TRADEMARK OFFICE
CERTIFICATE OF CORRECTION

PATENT NO. : 5,691,010

DATED : Nov. 25, 1997

INVENTOR(S) : Kuramoto et al.

It is certified that error appears in the above-identified patent and that said Letters Patent is hereby corrected as shown below:

Col. 1, line 36, replace "japanese" by --Japanese--.

Col. 6, line 19, replace "200 V" by -- - 200 V--.

Signed and Sealed this

Twenty-fourth Day of February, 1998

Attest:

BRUCE LEHMAN

Attesting Officer

Commissioner of Patents and Trademarks